US008569175B2

(12) United States Patent
Reber et al.

(10) Patent No.: US 8,569,175 B2
(45) Date of Patent: Oct. 29, 2013

(54) METHOD FOR DRY CHEMICAL TREATMENT OF SUBSTRATES AND ALSO USE THEREOF

(75) Inventors: Stefan Reber, Gundelfingen (DE); Gerhard Willeke, Lahr (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 874 days.

(21) Appl. No.: 12/096,271

(22) PCT Filed: Dec. 6, 2006

(86) PCT No.: PCT/EP2006/011716
§ 371 (c)(1),
(2), (4) Date: Oct. 1, 2008

(87) PCT Pub. No.: WO2007/065658
PCT Pub. Date: Jun. 14, 2007

(65) Prior Publication Data
US 2009/0197049 A1    Aug. 6, 2009

(30) Foreign Application Priority Data
Dec. 8, 2005 (DE) .......................... 10 2005 058 713

(51) Int. Cl.
*H01L 21/302* (2006.01)
(52) U.S. Cl.
USPC ........... 438/706; 438/471; 438/477; 438/689; 438/694; 216/33; 216/58; 216/79; 257/E21.318

(58) Field of Classification Search
USPC ............ 438/689, 694, 706, 471, 477; 216/33, 216/58, 79; 257/E21.318
See application file for complete search history.

(56) References Cited

U.S. PATENT DOCUMENTS

| | | | |
|---|---|---|---|
| 4,149,905 A | | 4/1979 | Levinstein et al. |
| 4,231,809 A | | 11/1980 | Schmidt |
| 4,732,874 A | * | 3/1988 | Sparks ......................... 438/378 |
| 4,897,366 A | | 1/1990 | Smeltzer |
| 4,983,370 A | * | 1/1991 | Loritsch et al. ............... 423/340 |
| 5,340,410 A | * | 8/1994 | Endroes et al. ............... 136/258 |

(Continued)

FOREIGN PATENT DOCUMENTS

| | | |
|---|---|---|
| DE | 35 16611 A1 | 11/1986 |
| EP | 0 440 893 A1 | 8/1991 |

(Continued)

OTHER PUBLICATIONS

Th.J.M. Kuijer, L.J. Giling and J. Bloem, Journal of Crystal Growth, vol. 22 p. 29-33 (1974).*

(Continued)

*Primary Examiner* — Lan Vinh
*Assistant Examiner* — David Kaufman
(74) *Attorney, Agent, or Firm* — Millen, White, Zelano & Branigan, P.C.

(57) ABSTRACT

The invention relates to a method for dry chemical treatment of substrates selected from the group comprising silicon, ceramic, glass, and quartz glass, in which the substrate is treated in a heated reaction chamber with a gas which contains hydrogen chloride as etching agent, and also to a substrate which can be produced in this way. The invention likewise relates to uses of the previously mentioned method.

21 Claims, 4 Drawing Sheets

(56) References Cited

U.S. PATENT DOCUMENTS

| | | | |
|---|---|---|---|
| 5,578,133 A | 11/1996 | Sugino et al. | |
| 6,235,645 B1 * | 5/2001 | Habuka et al. | 438/758 |
| 6,471,771 B2 | 10/2002 | Dietze | |
| 2002/0160627 A1 * | 10/2002 | Kunz et al. | 438/787 |
| 2004/0045574 A1 * | 3/2004 | Tan | 134/1 |

FOREIGN PATENT DOCUMENTS

| | | |
|---|---|---|
| EP | 0 547 677 A2 | 6/1993 |
| EP | 0 617 456 A2 | 9/1994 |
| EP | 1 026 731 A1 | 8/2000 |
| GB | 2 134 711 A | 8/1984 |
| JP | 59-147438 A | 8/1984 |
| JP | 62 147722 | 7/1987 |
| JP | 62-147722 A | 7/1987 |
| JP | 6-151394 A | 5/1994 |
| JP | 9-129582 A | 5/1997 |
| JP | 10 70298 A | 3/1998 |
| JP | 11 40525 | 2/1999 |
| JP | 11-40525 A | 2/1999 |
| JP | 2003100693 A * | 4/2003 |
| JP | 2003-332240 A | 11/2003 |
| KR | 10 2004 0100405 A | 12/2004 |

OTHER PUBLICATIONS

R.S. Ronen and P.H. Robinson, "Hydrogen Chloride and Chlorine Gettering: An Effective technique for Improving Performance of Silicon Devices", Journal of the Electrochemical Society, vol. 119, pp. 747-751 (1972).*

Thomas A. Baginski and Joseph R. Monkowski, "The Role of Chlorine in the Gettering of Metallic impurities from Silicon", Journal of the Electrochemical Society, vol. 132, pp. 2031-2033 (1985).*

Th.J. Kuijer, L.J. Giling, & J. Bloem, "Gas Phase Etching of Silicon with HCl", J. Crystal Growth, vol. 22, p. 29-33 (1974).*

T. Baginski et al., "The Role of Chlorine in the Gettering of Metallic Impurities from Silicon", Journal of Electrochemical Society, vol. 132, No. 8 (Aug. 1985) pp. 2031-2033.

Th. J. M. Kuijer et al., "Gas Phase Etching of Silicon With HCl", Journal of Crystal Growth, vol. 22 (1974) pp. 29-33.

* cited by examiner

METHOD FOR DRY CHEMICAL TREATMENT OF SUBSTRATES AND ALSO USE THEREOF

The invention relates to a method for dry chemical treatment of substrates selected from the group comprising silicon, ceramic, glass, and quartz glass, in which the substrate is treated in a heated reaction chamber with a gas containing hydrogen chloride as etching agent, and also to a substrate which can be produced in this way. The invention likewise relates to uses of the previously mentioned method.

For surface treatment and cleaning of wafers, a large number of etching methods are known from the state of the art, which are based on wet and dry chemical reactions with different chemicals. The methods used in the surface treatment and cleaning of substrates of this type can be subdivided into the following applications:

The removal of surface regions in order to avoid crystal damage to wafers. An example of this is the so-called damage etch in the pre-treatment of solar cells.

The removal of normally thin surface layers in order to free the wafer of surface impurities. There are included herein for example wet chemical oxidation with hot nitric acid as etching agent and also subsequent etching with hydrofluoric acid in order to remove the resulting $SiO_2$ layer.

Cleaning of the volume of a wafer by temperature treatment which can be accompanied by further etching steps. An example of this is the so-called gettering, i.e. temperature treatment in a phosphorus-containing atmosphere (e.g. $POCl_3$ and $O_2$), followed by the removal of the surface region, impurities from the volume of the wafer having accumulated as a result of the treatment.

Structuring of the surface. There is included herein for example the texturing etch termed "random pyramids" for the production of pyramid structures on silicon in order to improve light coupling of solar cells. A frequently occurring problem hereby is that the etches used do not etch different crystal orientations isotropically and consequently no uniform etching pattern is produced, which is the case for example with the random pyramid etch in KOH/alcohol solution. A further problem with isotropic methods for the texturing of surfaces of solar cells is that a predamaged crystal surface is often required in order to ensure a homogeneous texture, as is the case for example with acidic wet chemical texturing etches or a plasma texturing etch.

Starting herefrom it was the object of the present invention to provide a method which can provide the cleaning of wafers or other substrates which require high purity, the method requiring to be able to be implemented in as simple a manner as possible so that even a combination of different pre-treatment steps is made possible.

This object is achieved by the generic method having the characterising features of claim 1, the method having the features of claim 17, the substrate having the features of claim 18 and also by the uses in claims 19 to 22. The further dependent claims reveal advantageous developments.

According to the invention, a method for dry chemical treatment of substrates selected from the group comprising silicon, ceramic, glass and quartz glass is provided, in which the substrate is treated in a heated reaction chamber with an etching gas comprising a chlorine-containing gas or a gas which contains at least one chlorine-containing compound.

It is now essential with the method according to the invention that, during the treatment, cleaning of the substrate is effected in that the temperature and the concentration of the chlorine-containing compound in the etching gas are chosen such that impurities and/or foreign atoms which are contained in the volume are removed at least partially.

With respect to the pre-treatment of wafers, i.e. silicon discs, this method according to the invention involves a chemical reaction with the silicon and with the foreign atoms contained in the silicon being initiated by the temperature-controlled etching gas, as a result of which the silicon is transferred from the solid into the gaseous phase and also the foreign atoms are converted into chlorides. By skilful choice of the gas composition and the temperature, effects can be exploited which represents a significantly better alternative relative to the etching applications known from the state of the art.

Thus the possibility exists of exploiting the following effects which are described in the example of HCl-containing gas:

1. At high temperatures (approx. 1100° C. and higher), the HCl gas etches the Si surface very rapidly, isotropically and with high uniformity, i.e. a reflective surface is produced.
2. At average temperatures (approx. 900-1100° C.), an average etching rate is achieved, the silicon surface is etched isotropically but not reflectively and is structured strongly isotropically. This functions both with surfaces without and with crystal damage.
3. At lower temperatures, the etching rate is very low and etching takes place reflectively.

At all temperatures, in addition to silicon atoms, metal atoms are also converted with chlorine from the etching gas into solid chlorides which can be transported away with the gas flow.

At average and high temperatures, metals, in particular the iron which is particularly damaging for solar cells, are very mobile in silicon and apt to diffuse. Impurity precipitates can dissolve and mobilise atoms of the precipitate. This is exploited according to the invention in that a silicon disc is subjected to a temperature treatment in a chlorine-containing atmosphere. The metals and surface silicon are thereby converted and transported away with the gas flow. If it is achieved by suitable temperature and gas composition that the flow of metal towards the surface is higher than the Si etching rate of the surface and if a very rapid transport away of the metal by means of the chlorine-containing gas can be achieved, then effective depletion of the metal in the volume takes place and the volume is cleaned. This effect can be increased even more by increasing the silicon surface by means of a texturing etch.

Preferably, the etching gas contains hydrogen chloride or is composed completely of hydrogen chloride. The concentration of the chlorine-containing compound can thereby be chosen from the range of 1 to 100% by volume. At the same time, a temperature of 700 to 1600° C. is preferred in order to enable diffusion of the foreign atoms which are contained in the volume of substrate to the surface of the substrate.

One variant of the method according to the invention concerns the removal of impurities from the substrate which are present in the form of precipitates. For the removal of precipitates of this type, preferably temperatures in the range of 300 to 1000° C. are chosen since, at this temperature, the dissolution of precipitates can be effected and, subsequently, a diffusion of the individual components to the surface follows. Only after dissolution of the precipitates are these then accessible subsequently to the chlorine-containing compound and, as described, can be converted chemically and removed.

The concentration of chlorine-containing compound in the etching gas is preferably chosen such that foreign atoms or dissolved components of precipitates located in the region of the surface of the substrate are converted into the corresponding chlorides.

The temperature and the concentration of the chlorine-containing compound in the etching gas are preferably coordinated to each other with the method according to the invention such that the diffusion rate of the foreign atoms in the direction of the substrate surface is greater than the etching rate for the substrate.

A further preferred variant of the method according to the invention provides that, during treatment of a surface layer of the substrate, etching and removal take place isotropically. At high temperatures, i.e. temperatures of approx. 1000° C. and higher, surface layers of a silicon disc can be removed at extremely high etching rates of ≥40 μm/min without further crystal damage being produced. The surface layer is thereby removed preferably at a thickness in the range of 5 to 50 μm, particularly preferred in the range of 10 to 20 μm. The methods known from the state of the art require for removals at a thickness in the latter range approx. 2 to 5 min. The method according to the invention can achieve an acceleration here by the factor 10.

The impurities and foreign atoms released during the etching can preferably be removed simply by the gas flow.

A further preferred variant of the method according to the invention concerns the possibility of isotropic texturing of substrate surfaces. Thus at average temperatures, i.e. temperatures in the range of 900 to 1100° C., average etching rates can be achieved which permit controlled texturing of the surface. Thus for example in the context of wafers, the light coupling, e.g. for solar cells, can be increased by texturing of this type, i.e. the reflectivity can be lowered in that the surface is treated with the gas composition according to the invention at the mentioned temperatures. In addition, thus light refraction or light scattering takes place, which ensures in particular improved light exploitation in the case of crystalline silicon thin film solar cells. A further variant provides that the surface of a silicon disc is textured on which subsequently a silicon layer is deposited so that, as a result of the wet texturing deposition on the previous surface of the disc, buried holes are formed. These holes have a reflective effect on the incident light beams and consequently also contribute to increasing the light exploitation (so-called light ravine).

Another preferred variant of the method according to the invention provides for the removal of surface layers in order to release surface impurities from substrates. For this purpose, lower temperatures in the range of approx. 300 to 900° C. should be chosen, the surface of a silicon disc then being cleaned effectively by the reactive chlorine-containing gas of for example metal impurities, only a very thin silicon layer being removed.

The combination of different pre-treatment steps is particularly preferred with the method according to the invention in order to enable an overall process of the pre-treatment of substrates.

A variant of an overall process conceived in this way which can be implemented as a continuous process has the following steps:

a) A substrate made of silicon is treated by gettering with an etching gas comprising a chlorine-containing gas or a gas which contains a chlorine-containing compound at temperatures in the range of 300 to 1600° C. in order to remove impurities and/or foreign atoms from the volume of the substrate.

b) Removal of a surface layer of the substrate is effected in order to remove crystal damage on the surface of the substrate.

c) Subsequently, an isotropic texturing of the surface of the substrate is effected.

With respect to steps a) and b), there are no compulsory prerequisites with respect to the sequence so that step a) can be implemented before, after or at the same time as step b) or even all three steps at the same time.

The overall process described here can be supplemented by further methods steps. There are included herein:

d) A layer made of silicon is deposited on the substrate treated with steps a) to c) by at least partial replacement of the etching gas for a deposition gas which contains chlorosilanes.

e) The layer deposited in d) is textured isotropically in order to achieve an increase in light exploitation.

f) A layer made of silicon is deposited by at least partial replacement of the etching gas for a deposition gas which contains chlorosilanes with complementary doping in order to produce a pn-transition.

Step e) can thereby be implemented both before and after step f).

According to the invention, a method for texturing wafers is also provided, in which a wafer is treated in a heated reaction chamber at temperatures of 900 to 1100° C. with a texturing gas comprising a chlorine-containing gas or a gas which contains at least one chlorine-containing compound.

According to the invention, a substrate is likewise provided selected from the group comprising silicon, ceramic, glass and quartz glass which can be produced according to the previously described method. Substrates of this type are distinguished by a superior purity relative to substrates known from the state of the art.

The method according to the invention is used in the described treatment steps during pre-treatment of substrates, i.e. cleaning the volume of substrates, removal of crystal damage in wafers, removal of surface impurities in substrates and texturing of wafers.

The subjects according to the invention are intended to be explained in more detail with reference to the subsequent Figures and examples without wishing to restrict the latter to the special embodiments shown here.

EXAMPLE 1

Volume Cleaning

Figure 1:
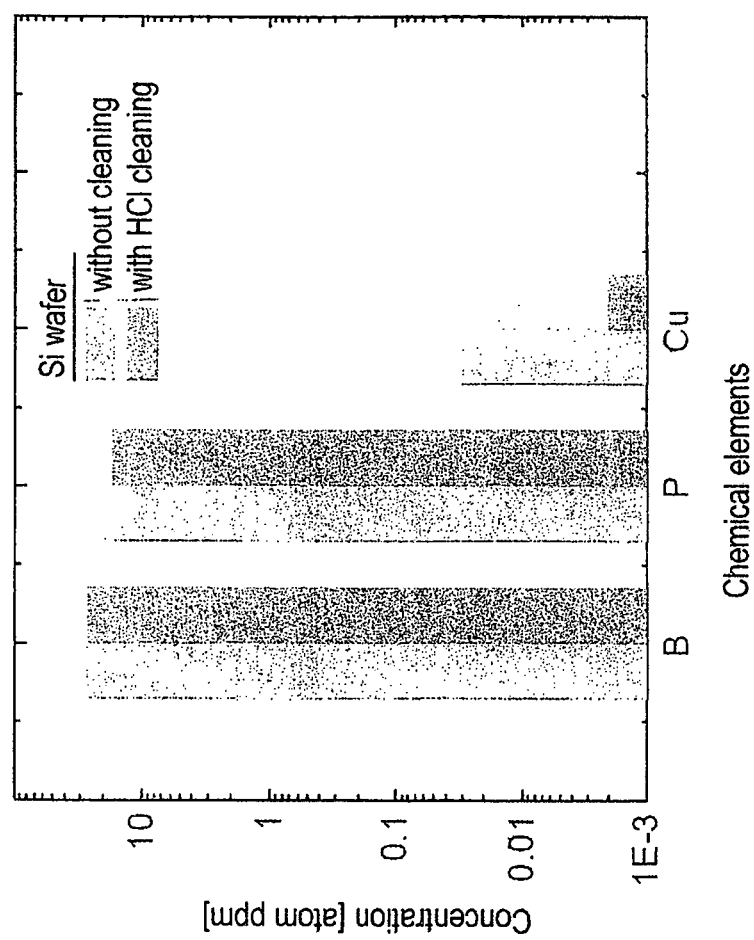
FIG. 1 shows the comparison of substrates treated according to the invention with substrates treated according to the state of the art, with reference to a diagram.

For detection of this effect, silicon discs were produced from metallurgical (i.e. contaminated with approx. 0.5% at doping agents and metals) raw materials. These still contained large quantities of doping agents and, somewhat more difficult to detect, also metals. Such silicon discs were investigated either directly or after a volume cleaning in a hot 20% HCl in $H_2$ atmosphere (1300° C., 5 min) by means of mass spectrometry. FIG. 1 shows the prepared measuring results: the doping agents which are difficult to convert into chlorides are retained completely, whilst for example the copper which is easier to convert is reduced by more than one order of magnitude.

EXAMPLE 2

Surface Texture

Multicrystalline silicon wafers were etched superficially in a hot HCl atmosphere (1000° C., 3 min, 20% HCl in $H_2$). The structure in FIG. 2a), a superficially microporous hole structure, is produced. The reflection behaviour is plotted in FIG. 2b): before the etching treatment an Si substrate has between 25 and 45% reflection, thereafter between 5 and 15%. Even in a production according to the invention of this structure, i.e. additional volume cleaning, the measured properties would be able to be maintained.

Figure 2A:
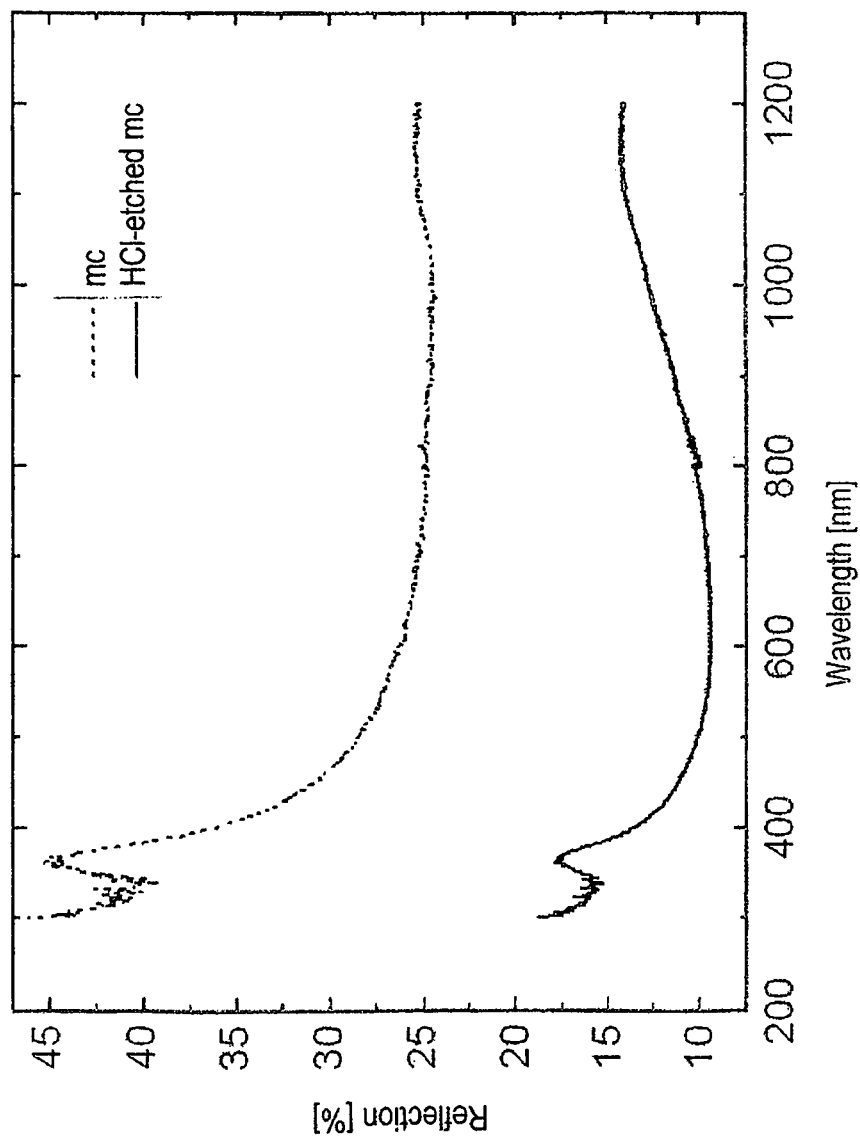
FIG. 2a shows a microscopic picture of the surface of a substrate textured according to the invention.
Figure 2B:
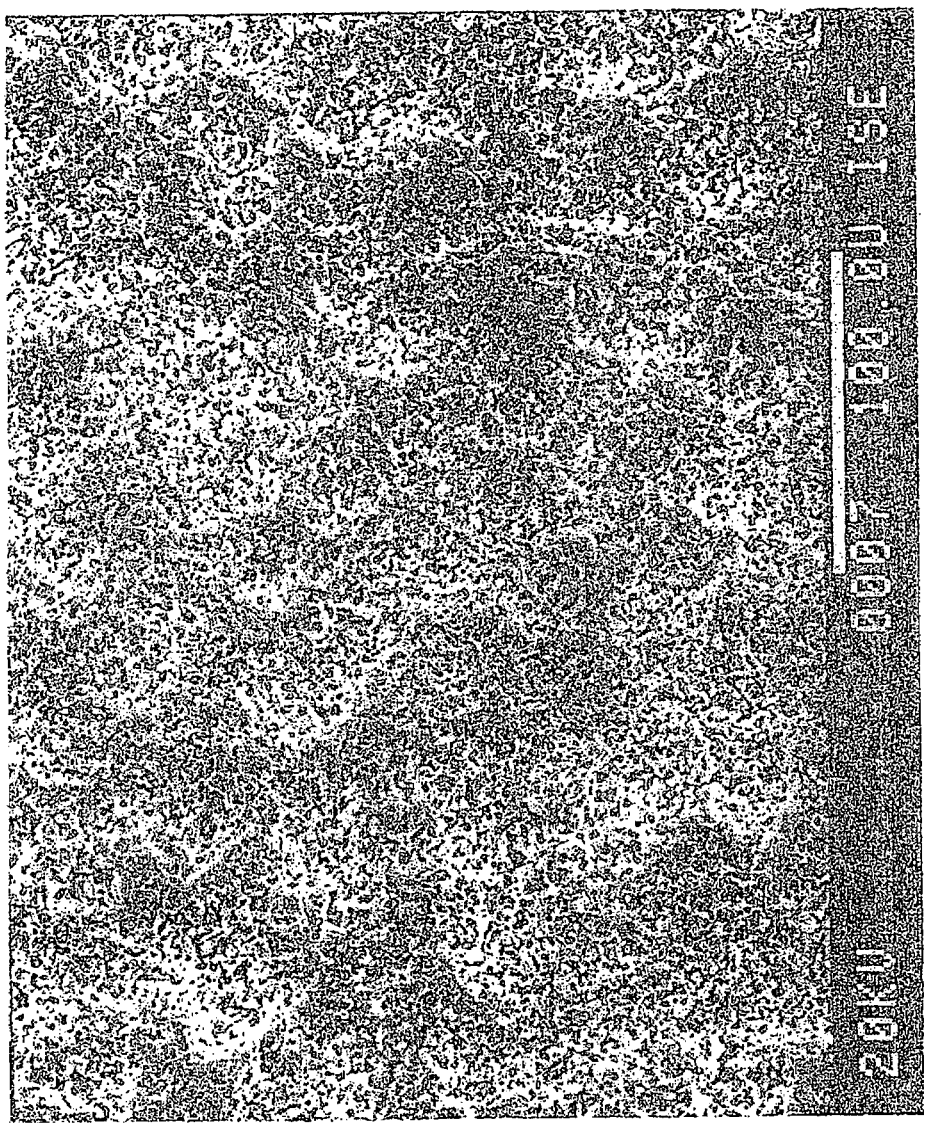
FIG. 2b shows a reflection spectrum of a substrate textured according to the invention.
Figure 3:
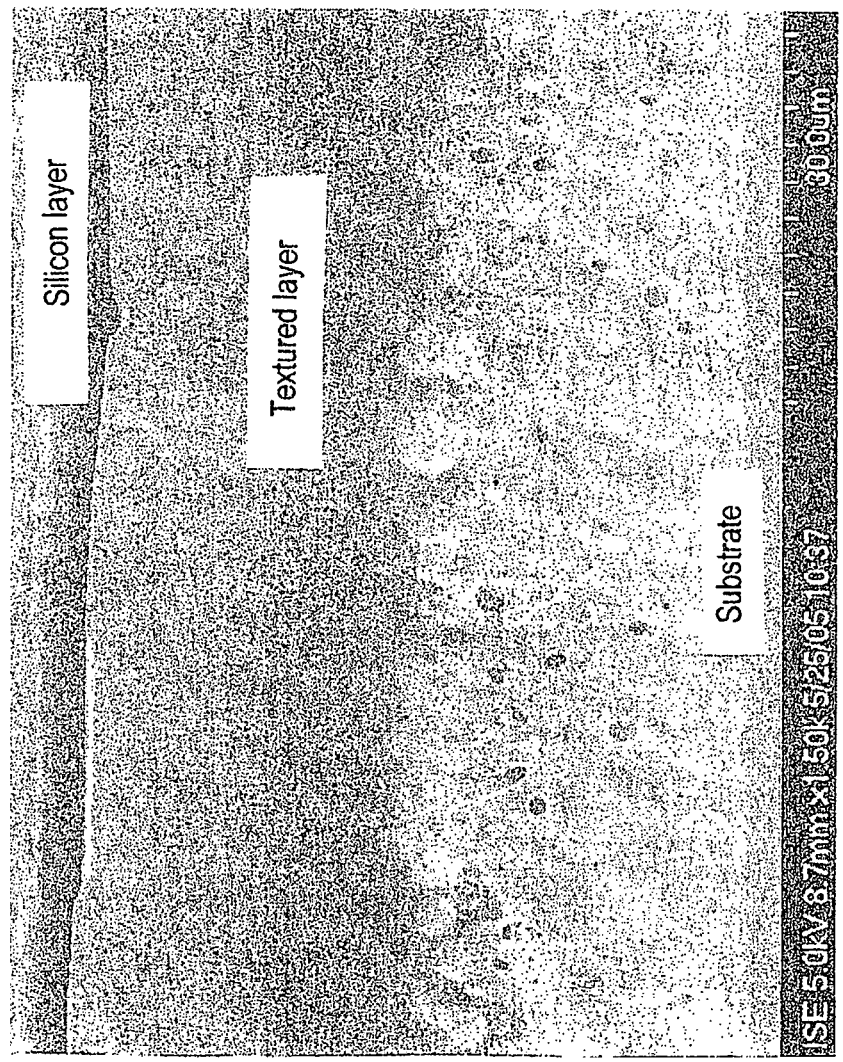
FIG. 3 shows a microscopic picture of the cross-section of a wafer which was textured according to the invention and subsequently coated with an additional silicon layer.

On a surface similar to that shown in FIG. 2a) and b), a silicon layer was deposited in situ. The transverse section in FIG. 3 shows that the holes produced by the texture are maintained partly as pores and consequently produce a light-reflecting effect. The deposited layer grows, despite the rough surface, very uniformly and with high crystal quality.

The invention claimed is:

1. Method for dry chemical treatment of a silicon substrate, in which the substrate is treated in a heated reaction chamber with an etching gas consisting of a chlorine-containing gas and/or a gas which contains at least one chlorine-containing compound and optionally $H_2$ gas, characterised in that, during the treatment, cleaning of the substrate is effected in that the temperature is 700 to 1600° C. and the concentration of the chlorine-containing gas or chlorine-containing compound is in the range of 20 to 100% by volume, such that impurities and/or foreign atoms which are contained in the volume of the substrate are removed at least partially.

2. Method according to claim 1, wherein the foreign atoms are metal atoms.

3. Method according to claim 1, wherein the treatment temperature is 700 to 1000° C. in order to dissolve impurities which are present in the substrate in the form of precipitates.

4. Method according to claim 1, wherein the concentration of the etching gas is chosen such that foreign atoms located in the region of the surface of the substrate are converted into the corresponding chlorides.

5. Method according to claim 1, wherein the temperature and the concentration of the etching gas are coordinated to each other such that the diffusion rate of the foreign atoms in the direction of the substrate surface is greater than the etching rate for the substrate.

6. Method according to claim 1, wherein, during treatment, a surface layer of the substrate is etched isotropically and removed.

7. Method according to claim 6, wherein the surface layer is removed at a thickness in the range of 5 to 50 μm.

8. Method according to claim 6, wherein impurities and foreign atoms released during the etching are removed from the substrate by gas flow.

9. Method according to claim 1, wherein, during treatment, the surface of the substrate is textured isotropically.

10. Method according to claim 1 having the following steps a), b) and c) conducted continually in the same chamber:
    a) a substrate made of silicon is treated by gettering with an etching gas comprising a chlorine-containing gas or a gas which contains a chlorine-containing compound at a temperature in the range of 700 to 1600 ° C. in order to remove impurities and/or foreign atoms from the volume of the substrate,
    b) removal of a surface layer of the substrate in order to remove crystal damage on the surface of the substrate and
    c) isotropic texturing of the surface of the substrate,
    step a) being implemented before, after or at the same time as step b) or all the steps a) to c) being implemented at the same time.

11. Method according to claim 10, further comprising, after steps a), b) and c), in a step d), a layer made of silicon is deposited on the substrate by at least partial replacement of the etching gas for a deposition gas which contains chlorosilanes.

12. Method according to claim 11, further comprising, after step d), in a step e), an isotropic texturing of the layer deposited in step d) is effected in order to increase the light exploitation.

13. Method according to claim 12, further comprising, after step d), in a step f), a layer made of silicon is deposited by at least partial replacement of the etching gas for a deposition gas which contains chlorosilanes with complementary doping in order to produce a pn-transition, step f) being implemented before or after step e).

14. Method for texturing a silicon wafer, in which a silicon wafer is treated in a heated reaction chamber with a texturing gas consisting of a chlorine-containing gas or a gas which contains at least one chlorine-containing compound and optionally $H_2$ gas at a temperature of 900 to 1100 ° C., wherein the concentration of the chlorine-containing gas or chlorine-containing compound is in the range of 20 to 100% by volume.

15. A silicon substrate prepared by the method according to claim 10.

16. Method according to claim 1 for cleaning a volume of substrates, which volume of substrates are silicon wafers.

17. Method according to claim 6 wherein surface impurities are removed from the substrate.

18. Method according to claim 6 wherein crystal damage is removed from the substrate.

19. Method according to claim 10 wherein the substrate is a silicon wafer and the method produces a textured silicon wafer.

20. Method according to claim 1, wherein the foreign atoms are iron atoms.

21. Method according to claim 6, wherein the surface layer is removed at a thickness in the range of 10 to 20 μm.

* * * * *

UNITED STATES PATENT AND TRADEMARK OFFICE
CERTIFICATE OF CORRECTION

PATENT NO. : 8,569,175 B2
APPLICATION NO. : 12/096271
DATED : October 29, 2013
INVENTOR(S) : Reber et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1104 days.

Signed and Sealed this
Fifteenth Day of September, 2015

Michelle K. Lee
*Director of the United States Patent and Trademark Office*